(12) United States Patent
Ishikawa et al.

(10) Patent No.: US 6,888,259 B2
(45) Date of Patent: May 3, 2005

(54) POTTED HYBRID INTEGRATED CIRCUIT

(75) Inventors: Takeshi Ishikawa, Nishikasugai-gun (JP); Takashi Nagasaka, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/144,734

(22) Filed: May 15, 2002

(65) Prior Publication Data

US 2002/0185752 A1 Dec. 12, 2002

(30) Foreign Application Priority Data

Jun. 7, 2001 (JP) ......................................... 2001-173033
Jun. 27, 2001 (JP) ......................................... 2001-195327

(51) Int. Cl.[7] .......................... H01L 23/29; H01L 23/28
(52) U.S. Cl. ........................ 257/788; 257/787; 257/790; 257/723; 257/685; 257/690
(58) Field of Search ................................ 257/788, 787, 257/790, 777, 723, 685, 686, 690

(56) References Cited

U.S. PATENT DOCUMENTS

| | | | | |
|---|---|---|---|---|
| 4,639,830 A | * | 1/1987 | Fukuoka | 361/779 |
| 6,096,381 A | * | 8/2000 | Zheng | 427/454 |
| 6,126,428 A | * | 10/2000 | Mitchell et al. | 425/110 |
| 6,316,840 B1 | * | 11/2001 | Otani | 257/787 |
| 6,407,461 B1 | * | 6/2002 | Farquhar et al. | 257/787 |
| 6,424,541 B1 | * | 7/2002 | Fazelpour | 257/666 |
| 6,576,500 B2 | * | 6/2003 | Furukawa et al. | 438/127 |
| 2001/0007371 A1 | * | 7/2001 | Kawaguchi | 257/698 |
| 2002/0003293 A1 | * | 1/2002 | Kobayashi | 257/676 |
| 2002/0056893 A1 | * | 5/2002 | Briar | 257/666 |

FOREIGN PATENT DOCUMENTS

| | | | | |
|---|---|---|---|---|
| JP | 55-52248 | * | 4/1980 | ................. 257/790 |
| JP | A-S58-48442 | | 3/1983 | |
| JP | A-S58-132954 | | 8/1983 | |
| JP | 62-18739 | * | 1/1987 | |
| JP | 63-162848 | * | 7/1988 | ................. 427/427 |
| JP | A-H1-209733 | | 8/1989 | |
| JP | 2-22846 | * | 1/1990 | ................. 257/790 |
| JP | 3-96257 | * | 4/1991 | ................. 257/790 |
| JP | 3-153588 | * | 7/1991 | |
| JP | 61-67247 | * | 4/1996 | ................. 257/790 |
| JP | A-H11-40710 | | 2/1999 | |

* cited by examiner

Primary Examiner—Alexander Oscar Williams
(74) Attorney, Agent, or Firm—Posz Law Group, PLC

(57) ABSTRACT

The adhesion between a protective layer, which covers a wiring layer, and a potting material, which covers a microchip, in a hybrid IC is improved without placing an additional material between the protective layer and the potting material. The potting material is separated from other electronic devices on the hybrid IC. To improve adhesion, the surface roughness of the protective layer is increased by adding insulating particles to the protective layer, striking the surface of the protective layer with ceramic particles, or replicating a mesh pattern of a screen mask on the surface of the protective layer. To keep the potting material separated from the other electronic devices, another potting material for covering the electronic devices, which is more viscous than the potting material for covering the microchip, is potted and hardened before the potting material for covering the microchip is potted.

14 Claims, 4 Drawing Sheets

POTTED HYBRID INTEGRATED CIRCUIT

CROSS REFERENCE TO RELATED APPLICATION

This application is based on and incorporates herein by reference Japanese Patent Applications No. 2001-173033 filed on Jun. 7, 2001 and No 2001-195327 filed on Jun. 27, 2001.

BACKGROUND OF THE INVENTION

1. Field of the Invention

The present invention relates to a hybrid integrated circuit (hybrid IC), in which a microchip and a group of other electronic devices are located on a ceramic circuit board. The microchip and the group are respectively covered and protected with a different type of potting material.

2. Description of the Related Art

As shown in FIG. 1, in a proposed hybrid IC, a microchip 3 is located on a surface 1a of a ceramic circuit board 1. The microchip 3 is die-bonded to the surface 1a with conductive adhesive 4. The microchip 3 and bonding pads of wiring layers (not shown) are wire-bonded with bonding wires 5. The microchip 3, the bonding wires 5, and the bonding pads are covered and protected by a first potting material 7 such as epoxy resin.

The wiring layers, except for the bonding pads, are covered and protected by an insulating protective layer (not shown). Therefore, the protective layer is in contact with the periphery of the potting material 7 on the board 1 at an end of the protective layer, which surrounds the device 3. The adhesion between the protective layer and the potting material 7 is relatively poor, so the potting material 7 tends to peel after heat cycles during use or after a soldering step in the manufacturing process of the hybrid IC.

As a solution to the peeling issue, in JP-A-11-40710, an elastic thermosetting resin is placed between the protective layer and the potting material 7 to reduce the stress generated at the boundary between the protective layer and the potting material 7. The stress is caused by the difference in the thermal expansion coefficient between the protective layer and the potting material 7. However, the method of the publication requires a dedicated material and apparatus, which are relatively expensive. Therefore, the production cost of the hybrid IC is increased.

In the proposed hybrid IC, as shown in FIG. 1, other electronic devices 9 such as condensers are fixed to the surface 1a of the circuit board 1 with the conductive adhesive 4. Other electronic devices 9 are covered by a second potting material 8 such as silicone rubber. As shown in FIG. 1, the first potting material 7 tends to be in contact with one of the electronic devices 9 because the distances between the device 3 and other electronic devices 9 are reduced due to the requirement of high packing density. If the first potting material 7 is in contact with one of the electronic devices 9, the first potting material 7 and the conductive adhesive 4 tend to crack after heat cycles during use due to the stress at the boundary between the first potting material 7 and the electronic device 9. The stress is caused by the difference in the thermal expansion coefficient between the first potting material 7 and the electronic device 9.

SUMMARY OF THE INVENTION

The present invention has been made in view of the above aspects. The first object of the invention is to improve the adhesion between a protective layer, which covers a wiring layer, and a potting material, which covers a microchip, in a hybrid IC without placing an additional material between the protective layer and the potting material. The second object of the invention is to keep the potting material separated from other electronic devices.

To improve the adhesion between the protective layer and the potting material, the surface roughness of the protective layer is increased. To increase the roughness, insulating particles are added to the protective layer, the surface of the protective layer is struck with ceramic particles, or a mesh pattern of a screen mask is replicated on the surface of the protective layer in the manufacturing process of the hybrid IC.

To keep the potting material separated from the other electronic devices, another potting material, which is more viscous than the potting material for covering the microchip, is potted for covering the electronic devices and is hardened before the potting material for covering the microchip is potted.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The present invention will be described in detail with reference to various embodiments.

First Embodiment

Figure 1:
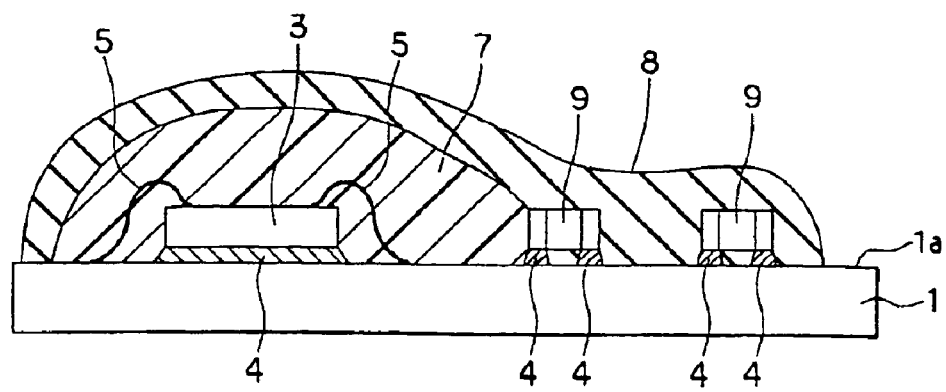
FIG. 1 is a cross-sectional view of a proposed hybrid IC.
Figure 2:
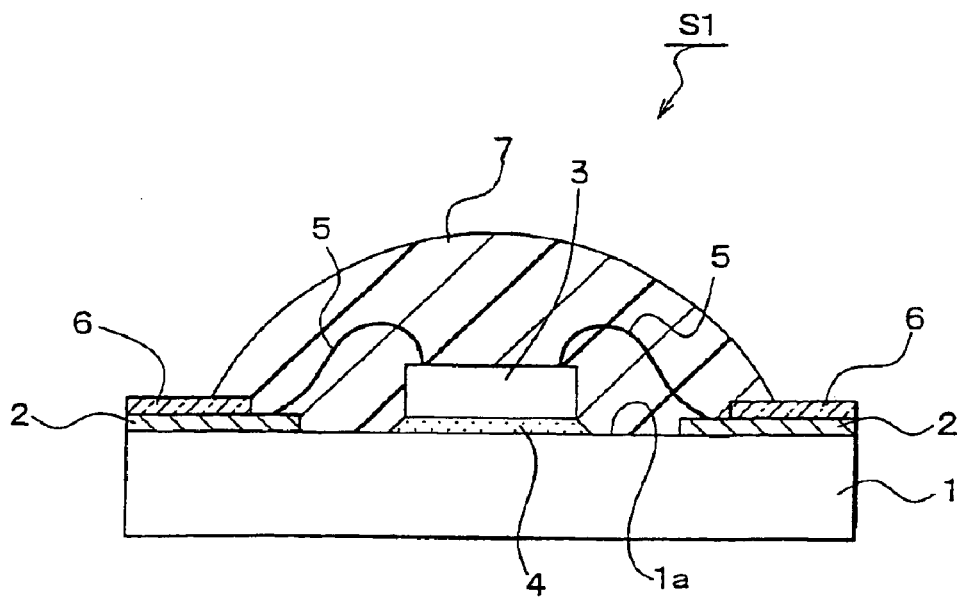
FIG. 2 is a cross-sectional view of the hybrid IC according to the first embodiment of the present invention.

As shown in FIG. 2, in a hybrid IC S1 according to the first embodiment, a microchip 3 is located on a surface 1a of a single-layered or multi-layered ceramic circuit board 1, which is made of a material such as alumia. The microchip 3 is die-bonded to the surface 1a with conductive adhesive 4, which is made of silver (Ag) paste, and electrically connected to bonding pads (electrically connected portions) of wiring layers 2 with bonding wires 5 (electrically connecting members), which are made of gold (Au) or Aluminum (Al). The wiring layers 2 are thick film conductors, which are formed by printing a conductive paste containing metal such as silver (Ag), silver-platinum (Ag—Pt), silver-palladium (Ag—Pd), and copper (Cu) on the surface 1a. The microchip 3, the bonding wires 5, and the bonding pads of the wiring layers 2 are covered and protected by a moisture-proof potting material 7 such as epoxy resin.

Figure 3:
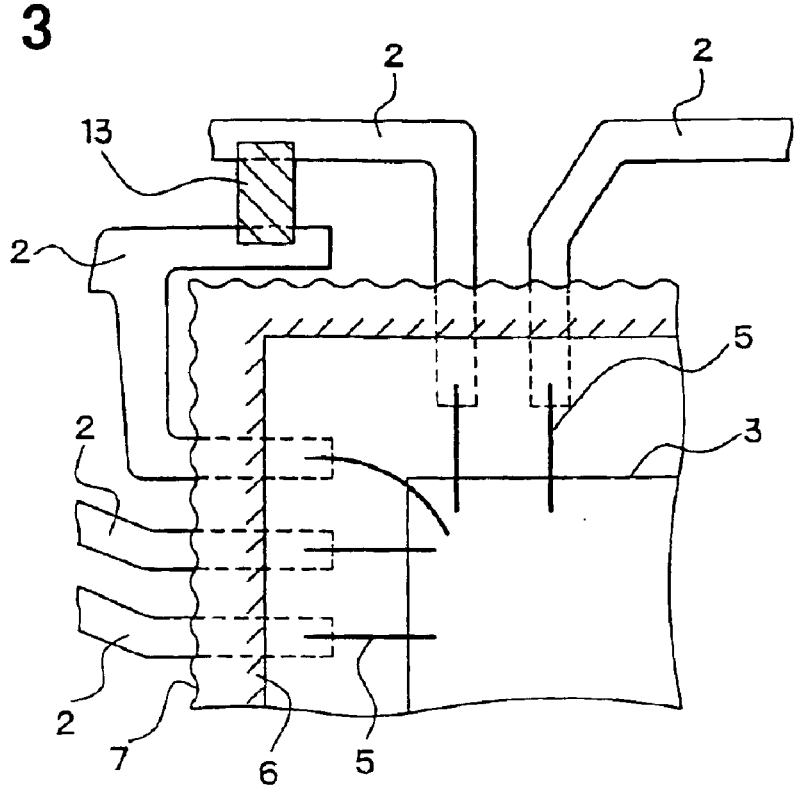
FIG. 3 is an enlarged partial plan view of the hybrid IC according to the first embodiment.

The wiring layers 2, except for the bonding pads, are covered and protected by an insulating protective layer 6, which is made of a material such as borosilicate lead glass. As shown in FIGS. 2 and 3, the potting material 7 overlaps the protective layer 6 at the periphery of the potting material 7. As shown in FIG. 3, a resistor 13, which is located between wiring layers 2, is also covered and protected by the protective layer 6. The resistor 13 is a thick film resistor made of a material such as ruthenium oxide ($RuO_2$), lanthanum boride ($LaB_6$), or tin oxide ($SnO_2$).

Figure 4:
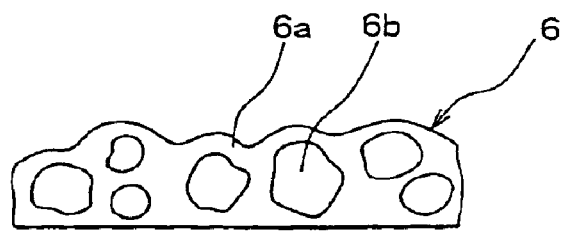
FIG. 4 is an enlarged partial cross-sectional view of the insulating protective layer of the hybrid IC according to the first embodiment.

As shown in FIGS. 2 and 3, an end of the protective layer 6, which surrounds the device 3 on the board 1, is in contact with the potting material 7. The surface of the end has a relatively high surface roughness to improve the adhesion between the protective layer 6 and the potting material 7. Specifically, as shown in FIG. 4, the protective layer 6 includes glass 6a and insulating particles 6b, which are made of a ceramic material such as zirconia ($ZrO_2$) for increasing the surface roughness of the protective layer 6. Therefore, the adhesion between the protective layer 6 and the potting material 7 is improved to prevent the potting material 7 from peeling without placing a dedicated material between the protective layer 6 and the potting material 7. In addition, neither the adhesion between the protective layer 6 and the surface underlying the protective layer 6 nor the durability of the protective layer 6 is affected by the insulating particles 6b.

The hybrid IC S1 according to the first embodiment is manufactured as follows. A conductive paste is printed in the shape of the wiring layer 2 on the surface 1a of the ceramic circuit board 1. The printed ceramic circuit board 1 is baked at e.g., 800 to 900° C. to complete the wiring layer 2. Then, the protective layer 6 is formed to cover a predetermined area of the wiring layer 2. Specifically, pasty glass 6a and insulating particles 6b, which has a mean particle size of e.g., 10 micrometers, are mixed such that the particles 6b account for e.g., 20 weight % in the mixture. The mixture is screen-printed on the predetermined area. The screen-printed ceramic circuit board 1 is baked at e.g., 500 to 600° C. to complete the protective layer 6.

Figure 6:
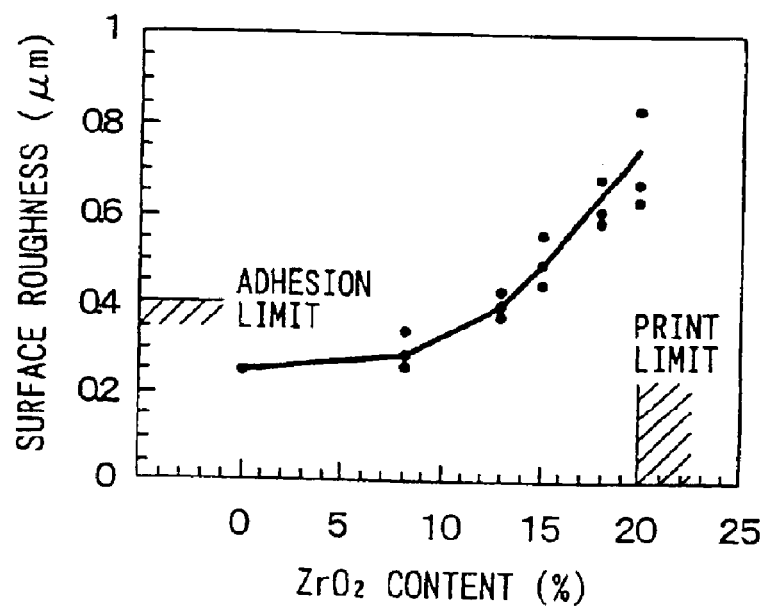
FIG. 6 is a graph showing the correlation between the mean surface roughness and the $ZrO_2$ content of the insulating protective layer.

If the content is greater than 20 weight %, the mixture can not be screen-printed. On the other hand, a good adhesion occurs if the surface roughness of the protective layer 6 is greater than 0.4 micrometers. The surface roughness increases as the content is increased, as shown in FIG. 6. Therefore, it is preferred that the content of the particles 6b in the mixture be in the range between about 13 and 20 weight %.

Subsequently, the microchip 3 is adhered to the surface 1a using the conductive adhesive 4 and fixed by hardening the adhesive 4. The microchip 3 and the bonding pads of the wiring layers 2 are wire-bonded with the bonding wires 5. Finally, the potting material 7, which includes epoxy resin, is potted and baked for hardening the resin. For the hybrid IC S1 in FIGS. 2 and 3, the baking is conducted in two steps. The first baking is conducted at 100° C. for one hour, and the second baking is conducted at 150° C. for three hours.

Figure 5:
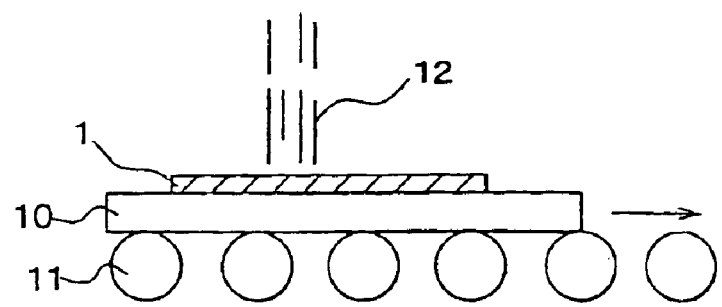
FIG. 5 is a view showing the jet scribing method for increasing the surface roughness of the insulating protective layer.

In the hybrid IC S1 in FIGS. 2 and 3, the surface roughness of the protective layer 6 is increased using the insulating particles 6b. However, as shown in FIG. 5, the surface roughness may be increased by a jet scrubbing method, in which the surface of the protective layer 6 is struck by ceramic particles made of alumia. As shown in FIG. 5, the ceramic circuit board 1, which includes the protective layer 6, is placed and slid on rollers 11 in the horizontal direction of FIG. 5 while alumia particles 12, which are abrasive particles, and water strike the surface of the protective layer 6. If the jet scrubbing method is used, the exposed surface of the wiring 2, which is not covered by the protective layer 6, is simultaneously polished and cleaned, so solder wets readily to the cleaned surface when electronic devices such as a condenser (not illustrated) are connected to the wiring 2 by soldering.

If the protective layer 6 is formed by screen-printing, the surface roughness may be increased by replicating a mesh pattern of a screen mask on the surface of the protective layer 6. Specifically, when the protective layer 6 is screen-printed, the screen mask is pushed to the protective layer 6 by a squeegee with a predetermined force. The surface roughness may also be increased by mechanically scrubbing or chemically eroding the surface of the protective layer 6. As a mechanical scrubbing, the surface of the protective layer 6 may be scrubbed with sandpaper. As a chemical eroding, the surface of the protective layer 6 may be eroded with ammonium fluoride solution. The surface roughness may also be increased by increasing the thixotropy of the raw material paste of the protective layer 6 to prevent the surface of the protective layer 6 from flattening.

Second Embodiment

Figure 7:
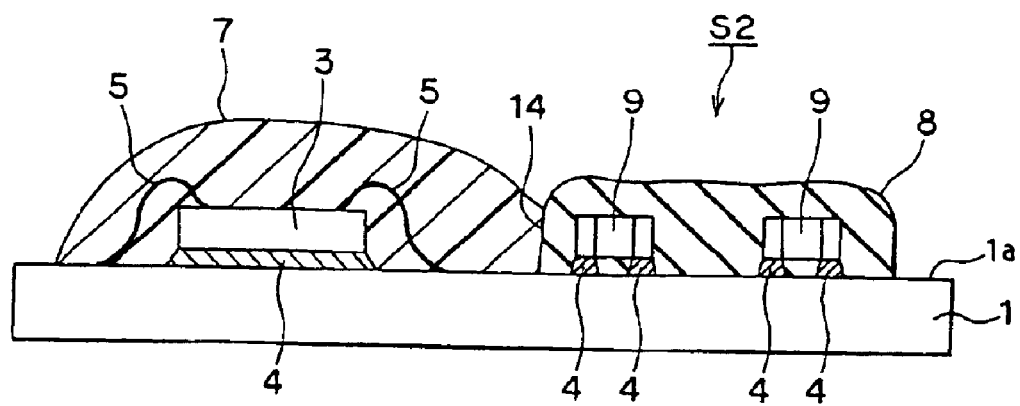
FIG. 7 is a cross-sectional view of the hybrid IC according to the second embodiment of the present invention.

As shown in FIG. 7, a hybrid IC S2 according to the second embodiment has a ceramic circuit board 1, a microchip 3, and other electronic devices 9 such as a condenser. The microchip 3 and the electronic devices 9 are located on a surface 1a of the ceramic circuit board 1. The microchip 3 and the electronic devices 9 are fixed to the surface 1a with the conductive adhesive 4. The microchip 3 is covered by a moisture-proof potting material 7 (first potting material) such as epoxy resin, which is thermally hardened. The first potting material 7 has relatively low viscosity before being hardened. The electronic devices 9 are covered by another moisture-proof potting material 8 (second potting material) such as silicone rubber or silicone gel, which is thermally hardened. The second potting material 8 has relatively high viscosity before being hardened. The boundary 14 between the potting materials 7, 8 is located between the microchip 3 and the nearest electronic device 9, as shown in FIG. 7. Although not illustrated, a plurality of leads are connected to the periphery of the ceramic circuit board 1 by soldering. A circuit on the ceramic circuit board 1 is electrically connected to another circuit outside of the board 1 with the leads.

In the hybrid IC S2 in FIG. 7, the first potting material 7 is in contact with none of the electronic devices 9. Thus, the first potting material 7 and the conductive adhesive 4 are prevented from cracking after heat cycles during use due to the stress at the boundary between the first potting material 7 and the electronic devices 9. Although the potting materials 7, 8 contact each other at the boundary 14, the stress at the boundary 14 is relatively low due to the materials included in the potting materials 7, 8. Therefore, no cracks are generated in the proximity of the boundary 14.

Figure 8A:
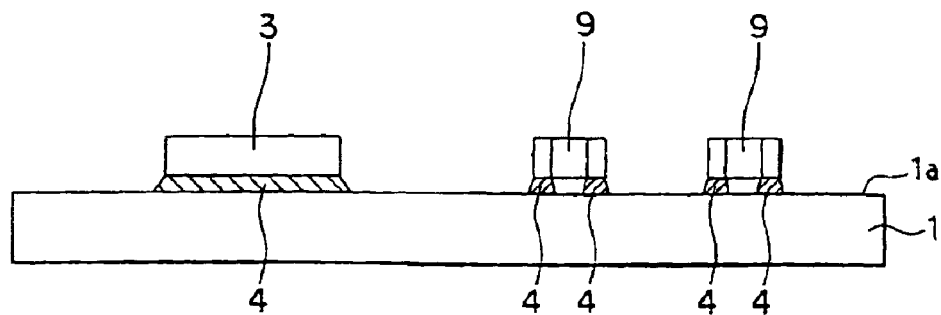
FIGS. 8A to 8C are cross-sectional views showing the manufacturing process of the hybrid IC according to the second embodiment.
Figure 8B:
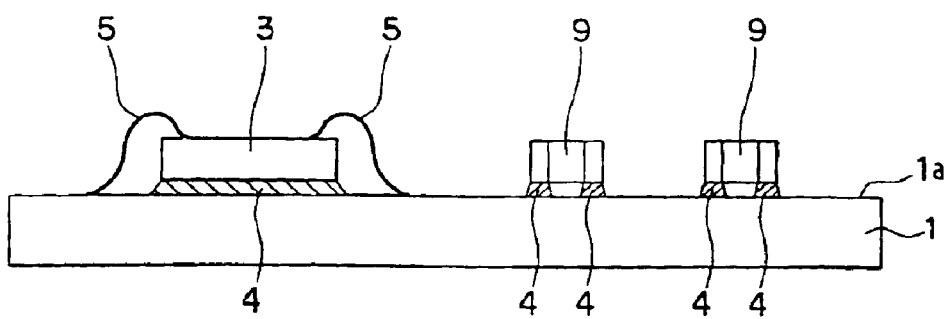
Figure 8C:
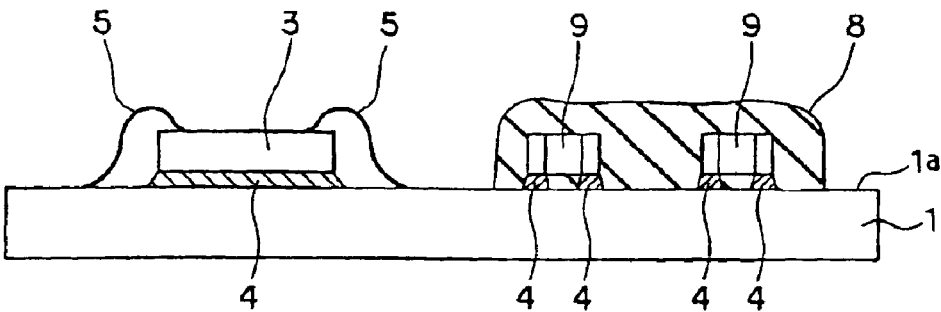

The hybrid IC S2 in FIG. 7 is manufactured through the steps shown in FIGS. 8A to 8C. After the plurality of leads (not illustrated) are connected to the periphery of the ceramic circuit board 1 by soldering, the conductive adhesive 4 is printed at a predetermined position on the surface 1a. Then, the microchip 3 and the electronic devices 9 are placed on the adhesive 4, as shown in FIG. 8A, and the adhesive 4 is hardened. The microchip 3 and bonding pads of the wiring layers 2 are wire-bonded with bonding wires 5, which are made of gold (Au) or Aluminum (Al), to form a circuit on the surface 1a, as shown in FIG. 8B.

Subsequently, as shown in FIG. 8C, the second potting material 8 in liquid state, which is the state before being hardened, is potted and hardened to cover and protect the electronic devices 9. Specifically, the second potting material 8 in liquid state, which includes silicone rubber, is potted by a dispensing machine. Then, the second potting material 8 in liquid state is hardened e.g., at 125° C. for one hour. Then, the first potting material 7 in liquid state, which is the state before being hardened, is potted and hardened 3 to cover and protect the microchip 3, the bonding wires 5, and the bonding pads. Specifically, the first potting material 7 in liquid state, which includes epoxy resin, is potted by a dispensing machine. Then, the first potting material 7 in liquid state is hardened e.g., at 100° C. for one hour and at 150° C. for three hours to complete the hybrid IC S2 in FIG. 7.

In the manufacturing process of the hybrid IC S2 in FIG. 7, the second potting material 8 in liquid state has higher viscosity than the first potting material 7 in liquid state such that the second potting material 8 in liquid state does not flow to reach the microchip 3 when the second potting material 8 in liquid state is potted. On the other hand, when the first potting material 7 in liquid state is potted after the second potting material 8 in liquid state is potted and hardened, the first potting material 7 in liquid state does not reach the electronic devices 9 because the electronic devices 9 are covered by the second potting material 8.

What is claimed is:

1. A hybrid IC comprising:
   a ceramic circuit board;
   a wiring layer located on a surface of the circuit board, wherein the wiring layer includes an electrically connected portion;
   a microchip located on the surface;
   an electrically connecting member that connects the microchip and the electrically connected portion of the wiring layer;
   a potting material that covers, the microchip, the connecting member, and the connected portion; and
   a protective layer that covers the wiring layer except for the connected portion, wherein the protective layer includes an overlapping portion that overlaps the potting material and wherein the surface of the overlapping portion has been roughened to improve the adhesion between the protective layer and the potting material, wherein the protective layer includes insulating particles to roughen the surface of the overlapping portion, and the insulating particles in the protective layer have a weight percentage that is equal to or lower than 20 wt %.

2. The hybrid IC as in claim 1, wherein the potting material overlaps the protective layer at the periphery of the potting material.

3. The hybrid IC according to claim 1, wherein the protective layer includes glass.

4. The hybrid according to claim 1, wherein the protective layer includes insulating particles made of ceramic material.

5. The hybrid IC according to claim 4, wherein the protective layer has a surface roughness that is equal to or greater then 0.4 μm.

6. The hybrid IC according to claim 5, wherein the weight percentage of the insulating particles is in a range of 13–20 wt %.

7. A hybrid IC comprising:
   a ceramic circuit board;
   a bonding pad located on a surface of the circuit board
   a microchip located on a surface of the circuit board and electrically connected to the bonding pad with a bonding wire;
   a first potting material that covers the bonding pad, the bonding wire, and the microchip;
   an electronic device located on the surface of the circuit board; and
   a second potting material that covers the electronic device, wherein each of the first potting material and the second potting material is exposed, wherein the first potting material includes an edge portion that partially overlaps the second potting material.

8. The hybrid IC according to claim 7, wherein the potting materials have been formed by potting the first and second potting materials in liquid state, and wherein the second potting material has been potted in a liquid state earlier than the first potting material.

9. The hybrid IC according to claim 7, wherein the viscosity of the first potting material in a liquid state is lower than that of the second potting material in a liquid state.

10. The hybrid IC according to claim 7, wherein the second potting material extends towards the microchip only as far as a boundary between the first potting material and the second potting material, wherein the boundary is located between the microchip and the electronic device.

11. The hybrid IC according to claim 7, wherein the first potting material includes an edge portion without a fillet between the ceramic circuit board and the first potting material.

12. The hybrid IC according to claim 7, wherein the microchip and the electronic device are disposed on a common plane.

13. The hybrid IC according to claim 7, wherein the first potting material and the second potting material cover different electric parts, respectively.

14. The hybrid IC according to claim 7 further comprising a conductive adhesive, on which the electronic device is disposed, wherein the first potting material covers the bonding pad, the bonding wire and the microchip, and wherein the second potting material covers the electronic device and the conductive adhesive.

* * * * *